United States Patent
Choi et al.

(10) Patent No.: US 12,495,676 B2
(45) Date of Patent: Dec. 9, 2025

(54) DISPLAY APPARATUS INCLUDING WIRING CONNECTED TO SOURCE AND DRAIN REGIONS OF SEMICONDUCTOR LAYER

(71) Applicant: Samsung Display Co., Ltd., Yongin-Si (KR)

(72) Inventors: Junwon Choi, Yongin-si (KR); Jaewon Kim, Yongin-si (KR); Junyoung Min, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 532 days.

(21) Appl. No.: 17/893,922

(22) Filed: Aug. 23, 2022

(65) Prior Publication Data

US 2023/0217706 A1    Jul. 6, 2023

(30) Foreign Application Priority Data

Dec. 30, 2021   (KR) ........................ 10-2021-0193422

(51) Int. Cl.
*H10K 59/121*   (2023.01)
*H10K 59/126*   (2023.01)
*H10K 59/131*   (2023.01)

(52) U.S. Cl.
CPC ..... *H10K 59/1213* (2023.02); *H10K 59/1216* (2023.02); *H10K 59/126* (2023.02); *H10K 59/131* (2023.02)

(58) Field of Classification Search
CPC . H10K 59/1213; H10K 59/131; H10K 59/126
See application file for complete search history.

(56) References Cited

U.S. PATENT DOCUMENTS

| | | | |
|---|---|---|---|
| 10,032,846 B2 | 7/2018 | Choi et al. | |
| 10,497,720 B2 | 12/2019 | Choi et al. | |
| 10,692,956 B2 | 6/2020 | Choi et al. | |
| 2017/0330928 A1 | 11/2017 | Choi et al. | |
| 2021/0193780 A1* | 6/2021 | Diao | H10K 59/1201 |
| 2021/0335989 A1 | 10/2021 | Diao et al. | |

FOREIGN PATENT DOCUMENTS

| | | |
|---|---|---|
| KR | 10-2017-0129337 A | 11/2017 |
| KR | 10-2017-0139213 A | 12/2017 |
| KR | 10-2018-0088551 A | 8/2018 |
| KR | 10-2047513 B1 | 11/2019 |

* cited by examiner

*Primary Examiner* — Lisa S Landis
(74) *Attorney, Agent, or Firm* — Innovation Counsel LLP

(57) ABSTRACT

A display apparatus is disclosed that includes a substrate, an additional transistor, a first wiring, a first insulating layer, and a second wiring. The additional transistor is located on the substrate and includes an additional semiconductor layer and an additional gate electrode. The first wiring is integrally formed with the additional gate electrode and extends in a first direction. The first insulating layer is located on the first wiring. The second wiring is located on the first insulating layer and extends in a second direction intersecting the first direction. The second wiring is connected to a source region and a drain region of the additional semiconductor layer.

20 Claims, 12 Drawing Sheets

DISPLAY APPARATUS INCLUDING WIRING CONNECTED TO SOURCE AND DRAIN REGIONS OF SEMICONDUCTOR LAYER

CROSS-REFERENCE TO RELATED APPLICATION

This application is based on and claims priority under 35 U.S.C. § 119 to Korean Patent Application No. 10-2021-0193422, filed on Dec. 30, 2021, in the Korean Intellectual Property Office, the disclosure of which is incorporated by reference herein in its entirety.

BACKGROUND

1. Field

The present disclosure relates to a display apparatus.

2. Description of the Related Art

Display apparatuses visually display data. A display apparatus is used as a display for a small product such as a mobile phone or is used as a display for a large product such as a television.

A display apparatus may include a plurality of sub-pixels that emit light by receiving electrical signals in order to display an image to the outside, and each of the plurality of sub-pixels may include a display element.

As the use of display apparatuses has recently been diversified, various designs for improving the quality of display apparatuses, for example, increasing a resolution of display apparatuses or preventing defects from external impact, have been attempted.

SUMMARY

One or more embodiments include a display apparatus that may be capable of reducing crosstalk and static electricity which may occur in a pixel circuit for driving a pixel. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus includes a substrate, an additional transistor located on the substrate and including an additional semiconductor layer and an additional gate electrode, a first wiring integrally formed with the additional gate electrode and extending in a first direction, a first insulating layer located on the first wiring, and a second wiring located on the first insulating layer and extending in a second direction intersecting the first direction. The second wiring may be connected to a source region and a drain region of the additional semiconductor layer.

The display apparatus may further include an operation control transistor including an operation control semiconductor layer and an operation control gate electrode, wherein the second wiring is a driving voltage line for applying a driving voltage to a source region of the operation control semiconductor layer.

The display apparatus may further include a driving transistor including a driving semiconductor layer and a driving gate electrode, and a capacitor overlapping the driving transistor and including a first electrode and a second electrode, wherein the driving gate electrode is integrally formed with the second electrode, and a source region of the driving semiconductor layer is connected to a drain region of the operation control semiconductor layer.

The display apparatus may further include an emission control transistor including an emission control semiconductor layer and an emission control gate electrode, wherein a source region of the emission control semiconductor layer is connected to a drain region of the driving semiconductor layer, and the first wiring is connected to the emission control gate electrode.

The display apparatus may further include a first initialization transistor including a first initialization semiconductor layer and a first initialization gate electrode, wherein the second wiring is an initialization voltage line for applying an initialization voltage to the first initialization transistor.

The display apparatus may further include a driving transistor including a driving semiconductor layer and a driving gate electrode, and a capacitor overlapping the driving transistor and including a first electrode and a second electrode, wherein the driving gate electrode is integrally formed with the second electrode, and a source region of the first initialization semiconductor layer is connected to the driving gate electrode.

The display apparatus may further include a second insulating layer located on the second wiring, a pixel electrode located on the second insulating layer and including an opening through which at least a part of the pixel electrode is exposed, an organic emission layer located on the pixel electrode in the opening, and a counter electrode located on the organic emission layer and extending to a top surface of a pixel-defining film, wherein the second wiring is electrically connected to the counter electrode.

The display apparatus may further include an operation control transistor including an operation control gate electrode and an operation control semiconductor layer, a driving transistor including a driving semiconductor layer and a driving gate electrode, and a capacitor overlapping the driving transistor and including a first electrode and a second electrode, wherein the driving gate electrode is integrally formed with the second electrode, and a source region of the driving semiconductor layer is connected to a drain region of the operation control semiconductor layer.

The display apparatus may further include an emission control transistor including an emission control semiconductor layer and an emission control gate electrode, wherein a source region of the emission control semiconductor layer is connected to a drain region of the driving semiconductor layer, and the first wiring is connected to the emission control gate electrode.

The display apparatus may further include a data line located on the first insulating layer, and an active pattern including a plurality of channel regions and a plurality of conductive regions, wherein the active pattern includes a shielding portion overlapping the data line, and the shielding portion is integrally formed with the additional transistor.

According to one or more embodiments, a display apparatus includes a scan line configured to transmit a scan signal, an emission control line configured to transmit an emission control signal, a data line intersecting the scan line and configured to transmit a data signal, a driving voltage line intersecting the scan line and configured to transmit a driving voltage, and an additional transistor including an additional semiconductor layer and an additional gate electrode, wherein the additional gate electrode is provided as a part of the emission control line, and when the additional transistor is driven, a same constant voltage is applied to a source region and a drain region of the additional semiconductor layer.

The driving voltage line may be connected to the source region and the drain region of the additional semiconductor layer.

The display apparatus may further include an operation control transistor including an operation control semiconductor layer and an operation control gate electrode, wherein a source region of the operation control semiconductor layer is connected to the driving voltage line, and the operation control gate electrode is connected to the additional gate electrode.

The display apparatus may further include a driving transistor including a driving semiconductor layer and a driving gate electrode, and a capacitor overlapping the driving transistor and including a first electrode and a second electrode, wherein the driving gate electrode is integrally formed with the second electrode, and a source region of the driving semiconductor layer is connected to a drain region of the operation control semiconductor layer.

The display apparatus may further include an emission control transistor including an emission control semiconductor layer and an emission control gate electrode, wherein a source region of the emission control semiconductor layer is connected to a drain region of the driving semiconductor layer, and the emission control line is connected to the emission control gate electrode.

The display apparatus may further include a first initialization transistor including a first initialization semiconductor layer and a first initialization gate electrode, and an initialization voltage line configured to apply an initialization voltage to the first initialization transistor, wherein each of the source region and the drain region of the additional semiconductor layer is connected to the initialization voltage line.

The display apparatus may further include a driving transistor including a driving semiconductor layer and a driving gate electrode, and a capacitor overlapping the driving transistor and including a first electrode and a second electrode, wherein the driving gate electrode is integrally formed with the second electrode, and a source region of the first initialization semiconductor layer is connected to the driving gate electrode.

The display apparatus may further include a second initialization transistor including a second initialization semiconductor layer and a second initialization gate electrode, wherein a source region of the second initialization semiconductor layer is connected to a drain region of the first initialization semiconductor layer.

The display apparatus may further include a display element including a pixel electrode and a counter electrode, and a second wiring configured to apply a same constant voltage, wherein the second wiring is electrically connected to the counter electrode.

The display apparatus may further include an active pattern including a plurality of channel regions and a plurality of conductive regions, wherein the active pattern includes a shielding portion overlapping the data line, and the shielding portion is integrally formed with the additional transistor.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
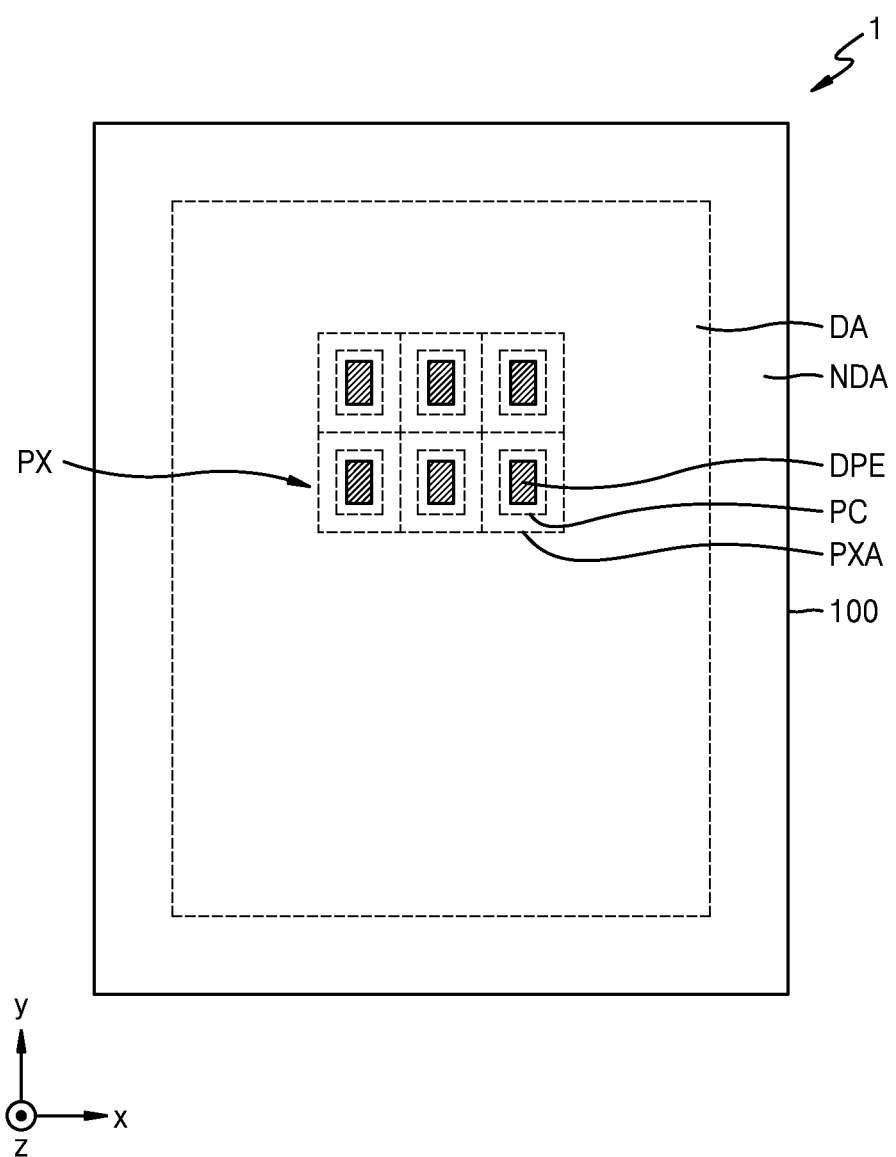
FIG. 1 is a plan view illustrating a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

The advantages and features of the disclosure, and methods of achieving the same, will become apparent with reference to embodiments described below in detail in conjunction with the accompanying drawings. The disclosure may, however, be embodied in many different forms and should not be construed as limited to embodiments set forth herein; rather these embodiments are provided so that this disclosure will be thorough and complete, and will fully convey the scope of the disclosure to one of ordinary skill in the art, and the scope of the disclosure is defined only by the accompanying claims.

Shapes, sizes, ratios, angles, numbers, etc. shown in the drawings for describing embodiments are merely examples, and the disclosure is not limited thereto. In the specification, the same reference numerals denote the same elements. In the description of embodiments, certain detailed explanations of related art are omitted when it is deemed that they may unnecessarily obscure the essence of the disclosure. Terms such as "including," "having," and "comprising" may be intended to indicate a plurality of components unless the terms are used with the term "only".

When a positional relationship between two items is described with the terms "on," "over," "under", "next to", etc., one or more items may be located therebetween unless the term "directly" is used in the expression.

It will be understood that although the terms "first," "second," etc. may be used herein to describe various components, these components should not be limited by these terms. These components are only used to distinguish one component from another. Accordingly, as used herein, a first element may be a second element within the technical idea of the disclosure.

Sizes of elements in the drawings may be exaggerated or contracted for convenience of explanation, and the disclosure is not limited thereto.

Features of various embodiments may be partially or entirely combined or associated, may be technically inter-operated in various ways, may each be independently implemented, or may be implemented together in association.

A display apparatus that is a device for displaying an image may be a portable mobile device such as a game player, a multimedia device, or a mini-PC. Examples of the display apparatus described below may include a liquid-crystal display, an electrophoretic display, an organic light-emitting display, an inorganic light-emitting display, a field-emission display, a surface-conduction electron-emitter display, a quantum dot display, a plasma display, and a cathode ray display. Although an organic light-emitting display apparatus is used as the display apparatus according to an embodiment, any of various display apparatuses as described above may be used.

FIG. 1 is a plan view illustrating a display apparatus 1, according to an embodiment.

Referring to FIG. 1, the display apparatus 1 may include a substrate 100, a pixel circuit PC, and a display element DPE. The substrate 100 may include a display area DA and a non-display area NDA. The display apparatus 1 may display an image in the display area DA. The non-display area NDA may be an area where an image is not displayed.

The display area DA may include a sub-pixel area PXA. In an embodiment, the display area DA may include a plurality of sub-pixel areas PXA. The plurality of sub-pixel areas PXA may be arranged in a first direction and a second direction intersecting the first direction. A right angle, an obtuse angle, or an acute angle may be formed between the first direction and the second direction. The following will be described assuming that the first direction and the second direction are orthogonal to each other. For example, the first direction may be an x direction or a −x direction of FIG. 1. The second direction may be a y direction or a −y direction of FIG. 1.

The pixel circuit PC may transmit an electrical signal to the display element DPE, and may control the display element DPE. In an embodiment, the pixel circuit PC may be located in the sub-pixel area PXA. In an embodiment, a plurality of pixel circuits PC may be respectively located in a plurality of sub-pixel areas PXA. In this case, the sub-pixel area PXA may be defined as an area where the pixel circuit PC is located. In an embodiment, the pixel circuit PC may include at least one transistor and at least one storage capacitor.

The display element DPE may emit light, and may be located in the sub-pixel area PXA. In an embodiment, a plurality of display elements DPE may be respectively located in a plurality of sub-pixel areas PXA. That is, the sub-pixel area PXA may be defined as an area where the display element DPE is located.

The display element DPE may receive an electrical signal from the pixel circuit PC, and may emit light according to the electrical signal. In this case, the display element DPE may define a sub-pixel PX. Because the plurality of display elements DPE may emit light, the display apparatus 1 may display an image in the display area DA.

The display element DPE may be an organic light-emitting diode including an organic emission layer. Alternatively, the display element DPE may be a light-emitting diode (LED). The light-emitting diode may have a micro-scale or nano-scale size. For example, the light-emitting diode may be a micro light-emitting diode. Alternatively, the light-emitting diode may be a nanorod light-emitting diode. The nanorod light-emitting diode may include gallium nitride (GaN). In an embodiment, a color conversion layer may be located on the nanorod light-emitting diode. The color conversion layer may include quantum dots. Alternatively, the display element DPE may be a quantum dot light-emitting diode including a quantum dot emission layer. Alternatively, the display element DPE may be an inorganic light-emitting diode including an inorganic semiconductor. The following will be described in detail assuming that the display element DPE is an organic light-emitting diode.

Figure 2:
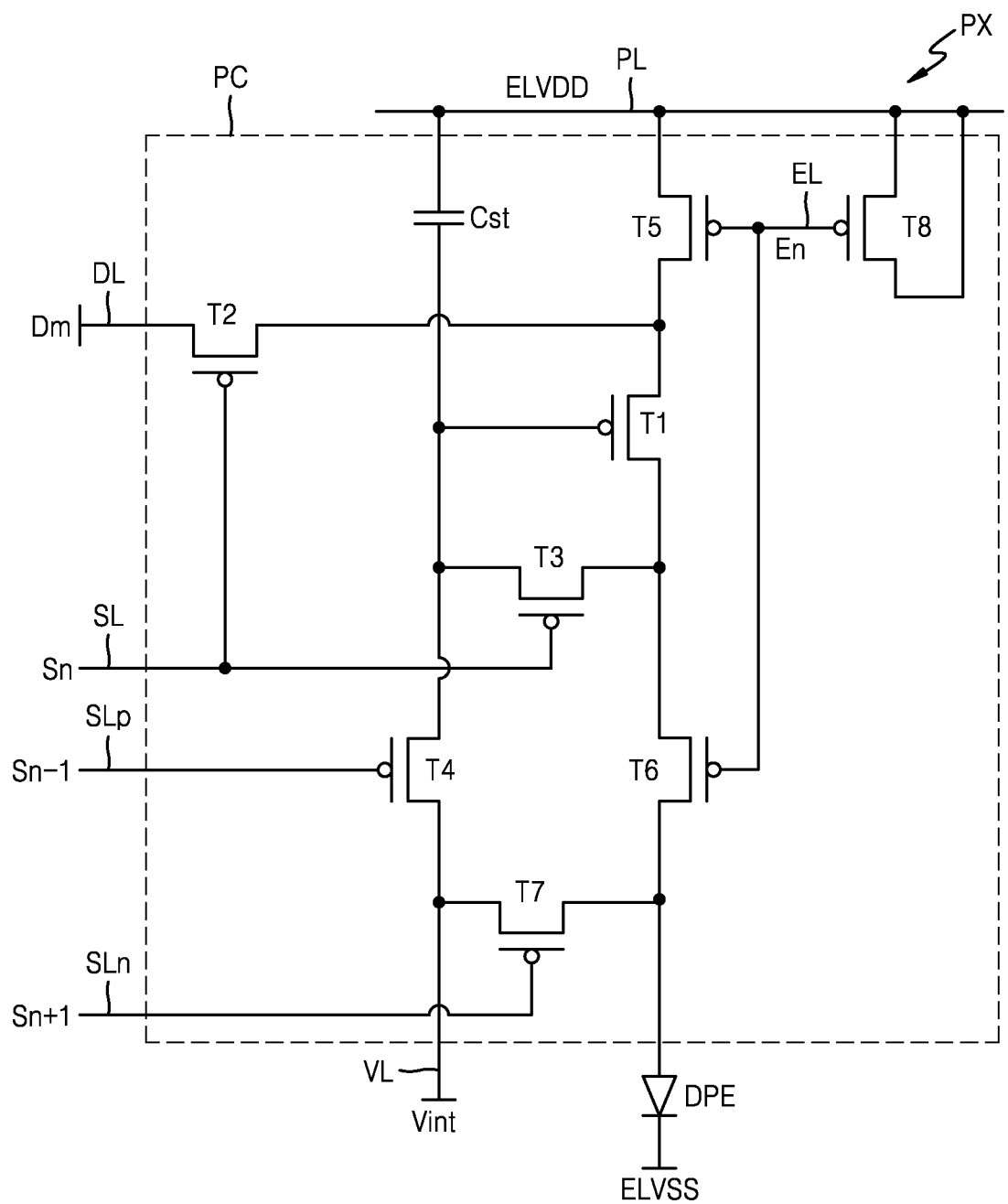
FIG. 2 is an equivalent circuit diagram illustrating a sub-pixel included in a display apparatus, according to an embodiment.

FIG. 2 is an equivalent circuit diagram illustrating one sub-pixel PX included in the display apparatus 1, according to an embodiment.

Referring to FIG. 2, the pixel circuit PC may include a driving transistor T1, a switching transistor T2, a compensation transistor T3, a first initialization transistor T4, an operation control transistor T5, an emission control transistor T6, a second initialization transistor T7, an additional transistor T8, and a storage capacitor Cst.

Although signal lines, an initialization voltage line VL, and a driving voltage line PL are provided in each pixel circuit PC in FIG. 2, in another embodiment, at least one of the signal lines, or the initialization voltage line VL may be shared by neighboring pixel circuits.

A driving drain electrode of the driving transistor T1 may be electrically connected to the display element DPE via the emission control transistor T6. The driving transistor T1 may receive a data signal Dm according to a switching operation of the switching transistor T2 and may supply driving current to the display element DPE.

A switching gate electrode of the switching transistor T2 may be electrically connected to a scan line SL, and a switching source electrode may be electrically connected to a data line DL. A switching drain electrode of the switching transistor T2 may be electrically connected to a source electrode of the driving transistor T1, and may be electrically connected to the driving voltage line PL via the operation control transistor T5. The switching transistor T2 may be turned on according to a scan signal Sn received through the scan line SL and may perform a switching operation of transmitting the data signal Dm transmitted through the data line DL to the driving source electrode of the driving transistor T1.

A compensation gate electrode of the compensation transistor T3 may be electrically connected to the scan line SL. A compensation source electrode of the compensation transistor T3 may be electrically connected to the driving drain electrode of the driving transistor T1, and may be electrically connected to a pixel electrode of the display element DPE via the emission control transistor T6. A compensation drain electrode of the compensation transistor T3 may be electrically connected to any one electrode of the storage capacitor Cst, a first initialization source electrode of the first initialization transistor T4, and a driving gate electrode of the driving transistor T1. The compensation transistor T3 may be turned on according to the scan signal Sn received through the scan line SL and may diode-connect the driving transistor T1 by electrically connecting the driving gate electrode to the driving drain electrode of the driving transistor T1.

A first initialization gate electrode of the first initialization transistor T4 may be electrically connected to a previous scan line SLp. A first initialization drain electrode of the first initialization transistor T4 may be electrically connected to the initialization voltage line VL. The first initialization source electrode of the first initialization transistor T4 may be electrically connected to any one electrode of the storage capacitor Cst, the compensation drain electrode of the compensation transistor T3, and the driving gate electrode of the driving transistor T1. The first initialization transistor T4 may be turned on according to a previous scan signal Sn−1 received through the previous scan line SLp and may perform an initialization operation of initializing a voltage of the driving gate electrode of the driving transistor T1 by transmitting an initialization voltage Vint to the driving gate electrode of the driving transistor T1.

An operation control gate electrode of the operation control transistor T5 may be electrically connected to an emission control line EL. An operation control source electrode of the operation control transistor T5 may be electrically connected to the driving voltage line PL. An operation control drain electrode of the operation control transistor T5 may be electrically connected to the driving source electrode of the driving transistor T1 and the switching drain electrode of the switching transistor T2.

An emission control gate electrode of the emission control transistor T6 may be electrically connected to the emission control line EL. An emission control source electrode of the emission control transistor T6 may be electrically connected to the driving drain electrode of the driving transistor T1 and the compensation source electrode of the compensation transistor T3. An emission control drain electrode of the emission control transistor T6 may be electrically connected to the pixel electrode of the display element DPE. The operation control transistor T5 and the emission control transistor T6 may be simultaneously turned on according to an emission control signal En received through the emission control line EL so that a driving voltage ELVDD is transmitted to the display element DPE and driving current flows through the display element DPE.

A second initialization gate electrode of the second initialization transistor T7 may be electrically connected to a next scan line SLn. A second initialization source electrode of the second initialization transistor T7 may be electrically connected to the pixel electrode of the display element DPE. A second initialization drain electrode of the second initialization transistor T7 may be electrically connected to the initialization voltage line VL. The second initialization transistor T7 may be turned on according to a next scan signal Sn+1 received through the next scan line SLn to initialize a pixel electrode of an organic light-emitting diode OLED.

An additional gate electrode of the additional transistor T8 may be electrically connected to the operation control gate electrode of the operation control transistor T5. An additional source region and an additional drain region of the additional transistor T8 may be connected to a second wiring WL2. When the additional transistor T8 is driven, the second wiring WL2 may supply the same constant voltage to the additional source electrode and the additional drain electrode of the additional transistor T8. Accordingly, a floating node may not occur in the additional transistor T8. The second wiring WL2 may be the driving voltage line PL for applying the driving voltage ELVDD to the operation control transistor T5. In this case, when the additional transistor T8 is driven, the same driving voltage ELVDD may be applied to the additional source electrode and the additional drain electrode of the additional transistor T8, thereby preventing a floating node. Accordingly, because a shielding portion located on the same layer as a semiconductor layer and overlapping the data line DL is integrally formed with an additional semiconductor layer of the additional transistor T8, the semiconductor layer may not include an island structure and thus may be robust to electrostatic discharge (ESD). The same effect may be obtained even when another type of second wiring described below is used.

The additional gate electrode may be connected to the operation control gate electrode of the operation control transistor T5. The additional gate electrode may be connected to the emission control gate electrode of the emission control transistor T6.

Figure 3:
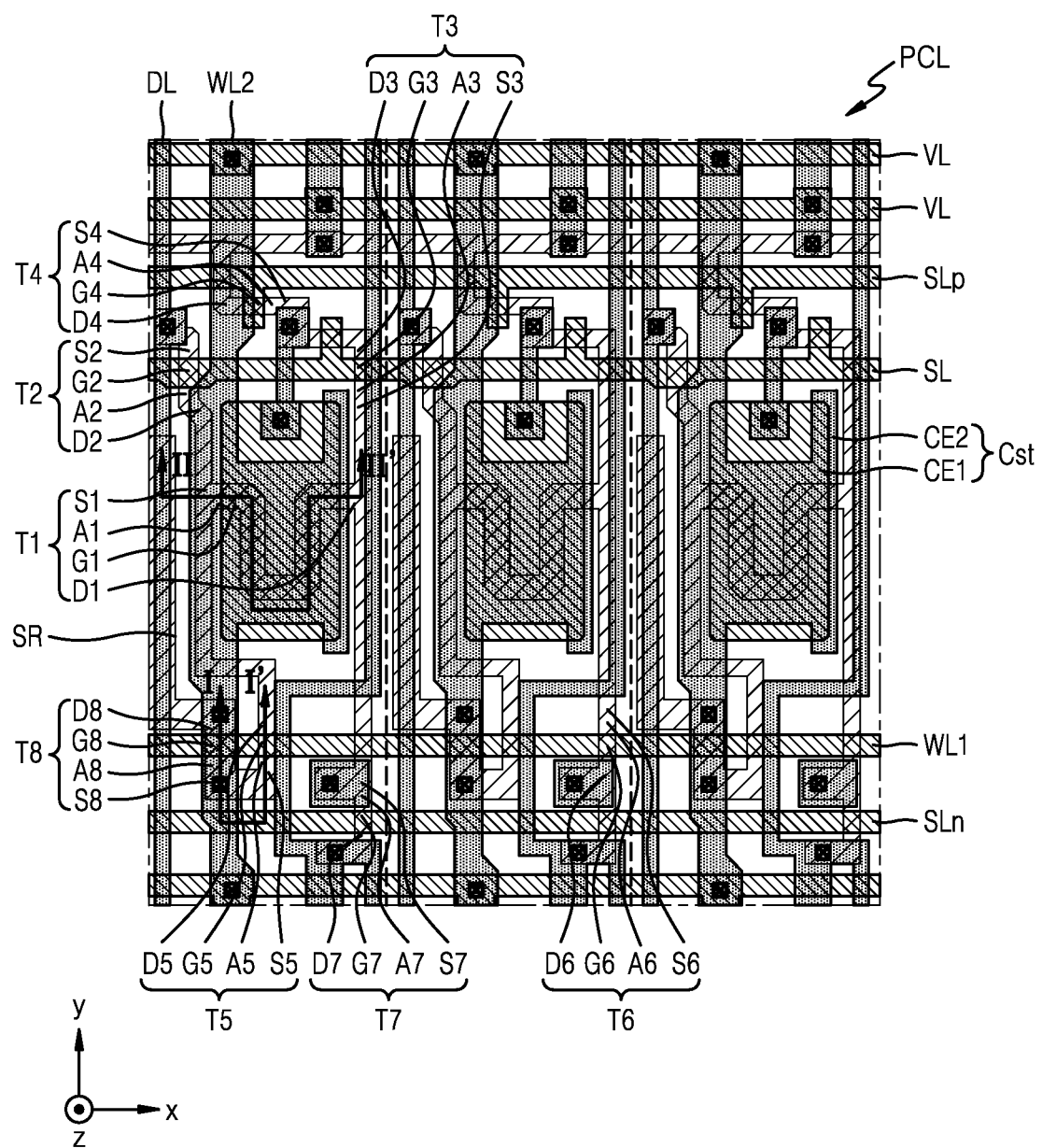
FIG. 3 is a plan view illustrating a sub-pixel area and a pixel circuit layer of a display apparatus, according to an embodiment.
Figure 4A:
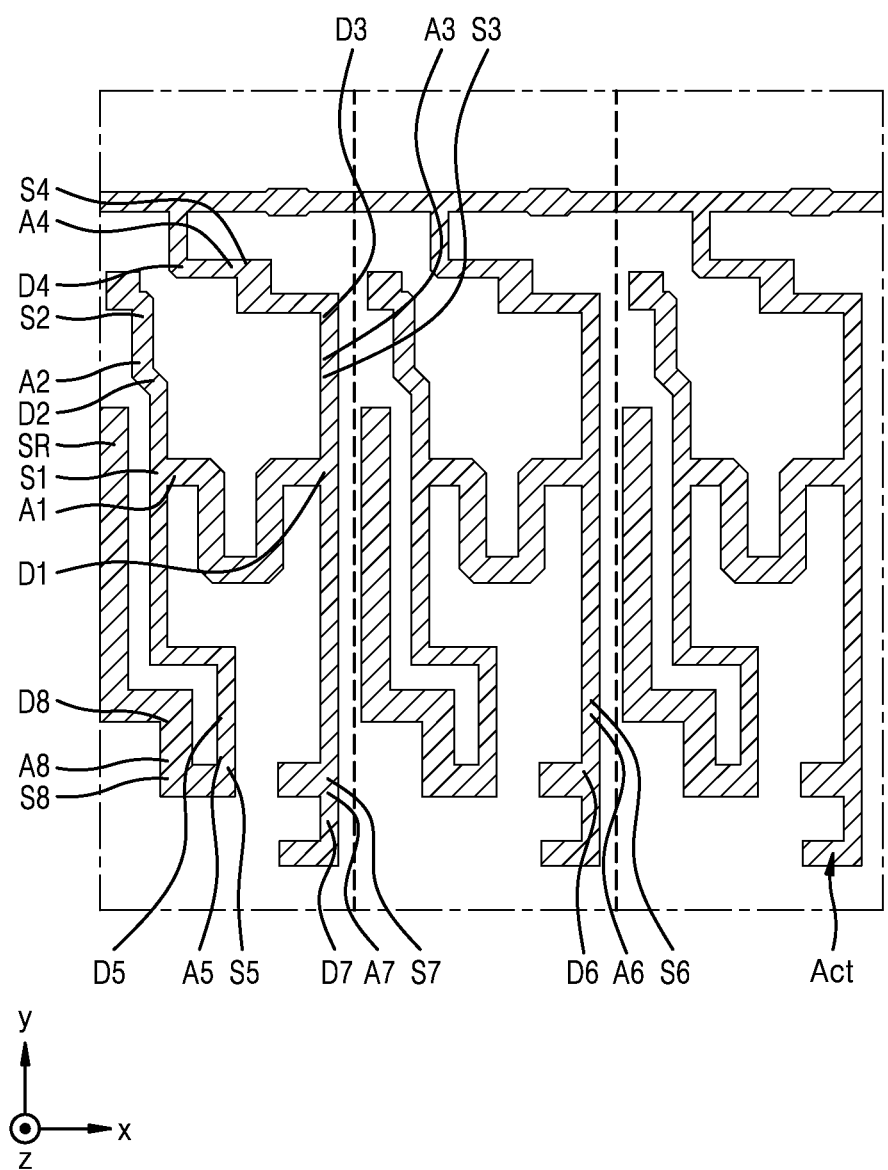
FIGS. 4A, 4B, and 4C are plan views partially illustrating elements of FIG. 3.
Figure 4B:
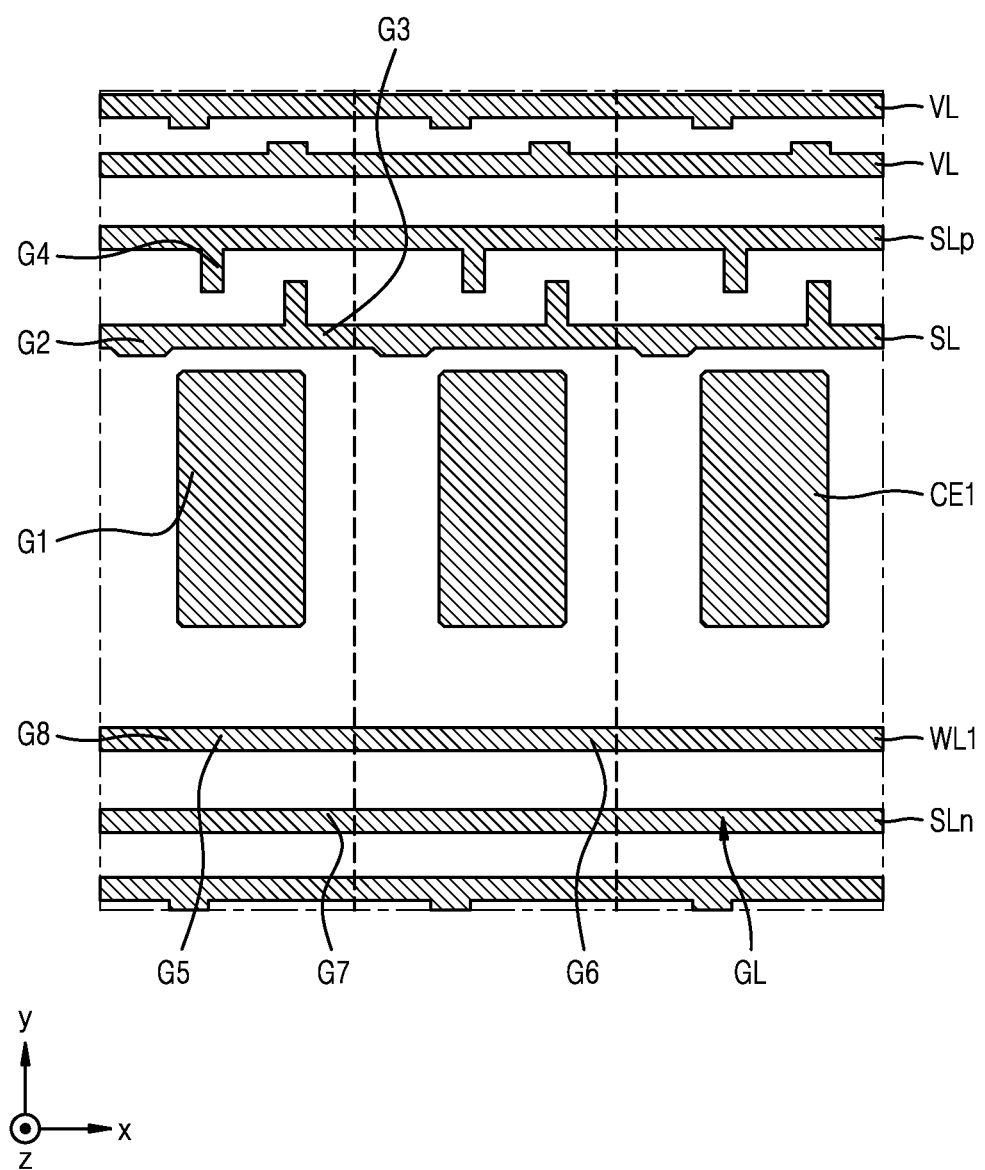
Figure 4C:
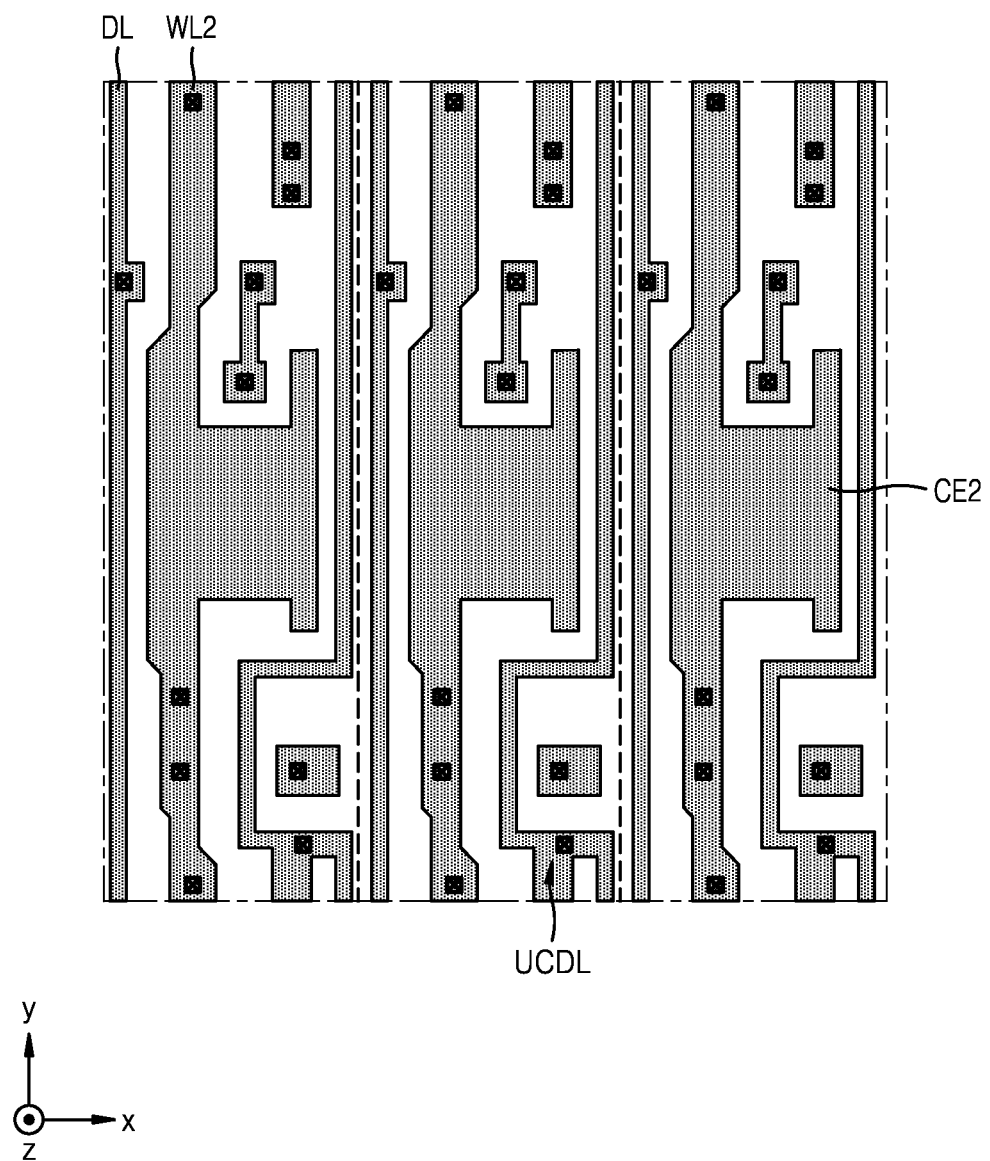

FIG. 3 is a plan view illustrating the sub-pixel area PXA and a pixel circuit layer PCL of the display apparatus 1, according to an embodiment. FIGS. 4A through 4C are plan views partially illustrating elements of FIG. 3. FIG. 4A is a plan view illustrating a semiconductor layer Act. FIG. 4B is a plan view illustrating a gate conductive layer GL. FIG. 4C is a plan view illustrating an upper conductive layer UCDL.

Referring to FIG. 3 and FIGS. 4A and 4B, the pixel circuit layer PCL may define the pixel circuit PC overlapping the sub-pixel area PXA. The pixel circuit PC may include at least one transistor and at least one storage capacitor. For example, the pixel circuit PC may include the driving transistor T1, the switching transistor T2, the compensation transistor T3, the first initialization transistor T4, the operation control transistor T5, the emission control transistor T6, the second initialization transistor T7, a shielding portion SR, and the storage capacitor Cst. The pixel circuit PC may include the additional transistor T8.

The pixel circuit layer PCL may include the semiconductor layer Act, the gate conductive layer GL, and the upper conductive layer UCDL. The semiconductor layer Act, the gate conductive layer GL, and the upper conductive layer UCDL may overlap the sub-pixel area PXA.

At least one transistor may be arranged along the semiconductor layer Act (FIG. 4A). Some portions of the semiconductor layer Act may correspond to semiconductor regions of the driving transistor T1, the switching transistor T2, the compensation transistor T3, the first initialization transistor T4, the operation control transistor T5, the emission control transistor T6, the second initialization transistor T7, and the additional transistor T8. In other words, the semiconductor regions of the driving transistor T1, the switching transistor T2, the compensation transistor T3, the first initialization transistor T4, the operation control transistor T5, the emission control transistor T6, the second initialization transistor T7, and the additional transistor T8 may be connected to one another and may be bent in various shapes.

The semiconductor layer Act may include a channel region, and a source region and a drain region on both sides of the channel region. A source region and a drain region may be a source electrode and a drain electrode of a corresponding transistor. For convenience of explanation, the following will be described assuming that a source electrode and a drain electrode are respectively a source region and a drain region.

The driving transistor T1 may include a driving channel region A1, a driving source region S1 and a driving drain region D1 on both sides of the driving channel region A1, and a driving gate electrode G1 overlapping the driving channel region A1. Because the driving channel region A1 overlapping the driving gate electrode G1 has a shape such as an omega shape, a long channel length may be maintained in a narrow space. When a length of the driving channel region A1 is large, a driving range of a gate voltage may be widened and the gradation of light emitted by a display element may be more precisely controlled, thereby improving display quality.

The switching transistor T2 may include a switching channel region A2, a switching source region S2 and a switching drain region D2 on both sides of the switching channel region A2, and a switching gate electrode G2 overlapping the switching channel region A2. The switching drain region D2 may be connected to the driving source region S1.

The compensation transistor T3 may include a compensation channel region A3, a compensation source region S3 and a compensation drain region D3 on both sides of the compensation channel region A3, and a compensation gate electrode G3 overlapping the compensation channel region A3. In some embodiments, the compensation transistor T3 may be a dual transistor, and may include compensation gate electrodes G3 overlapping two compensation channel regions A3. The compensation source region S3 may be connected to the driving drain region D1.

The first initialization transistor T4 may include a first initialization channel region A4, a first initialization source region S4 and a first initialization drain region D4 on both sides of the first initialization channel region A4, and a first initialization gate electrode G4 overlapping the first initialization channel region A4. In some embodiments, the first initialization transistor T4 may be a dual transistor, and may include first initialization gate electrodes G4 overlapping two first initialization channel regions A4. The first initialization source region S4 may be connected to the compensation drain region D3.

The operation control transistor T5 may include an operation control channel region A5, an operation control source region S5 and an operation control drain region D5 on both sides of the operation control channel region A5, and an operation control gate electrode G5 overlapping the operation control channel region A5. The operation control drain region D5 may be connected to the driving source region S1. The operation control drain region D5 may be connected to the switching drain region D2.

The emission control transistor T6 may include an emission control channel region A6, an emission control source region S6 and an emission control drain region D6 on both sides of the emission control channel region A6, and an emission control gate electrode G6 overlapping the emission control channel region A6. The emission control source region S6 may be connected to the driving drain region D1. The emission control source region S6 may be connected to the compensation source region S3.

The second initialization transistor T7 may include a second initialization channel region A7, a second initialization source region S7 and a second initialization drain region D7 on both sides of the second initialization channel region A7, and a second initialization gate electrode G7 overlapping the second initialization channel region A7. The second initialization drain region D7 may be connected to the first initialization drain region D4. The second initialization source region S7 may be connected to the emission control drain region D6.

The additional transistor T8 may include an additional channel region A8, an additional source region S8 and an additional drain region D8 on both sides of the additional channel region A8, and an additional gate electrode G8 overlapping the additional channel region A8. The additional source region S8 may be connected to the operation control source region S5. This is merely an example, and the additional source region S5 may be connected to a source region or a drain region of any of various transistors according to a position of the first wiring WL1 described below.

The shielding portion SR may overlap the data line DL and may extend parallel to the data line DL. The shielding portion SR may completely cover a width of the data line in the first direction (e.g., x direction or −x direction). That is, a width of the shielding portion SR in the first direction may be greater than a width of the data line DL in the first direction.

The shielding portion SR may be located on the semiconductor layer Act and may be integrally formed with an additional semiconductor layer including the additional source region S8, the additional channel region A8, and the additional drain region D8. Because the shielding portion SR is integrally formed with the additional semiconductor layer, the additional channel region A8 and the additional gate electrode G8 may be formed to form the additional transistor T8. The shielding portion SR may be located between a plurality of pixel circuits PC.

The shielding portion SR may be conductive. The shielding portion SR may shield the data line DL by overlapping the data line DL, thereby preventing driving current of the display element DPE from fluctuating due to a change in a voltage of the driving gate electrode G1 according to a change in the data signal Dm. That is, because a constant voltage is applied to the shielding portion SR, a voltage of the driving electrode G1 may be stable.

The gate conductive layer GL (FIG. 4B) may be located on the semiconductor layer Act with at least one insulating layer therebetween. The gate conductive layer GL may include the scan line SL, the previous scan line SLp, the emission control line EL, the initialization voltage line VL, and the driving gate electrode G1.

The scan line SL may extend in the first direction (e.g., x direction or −x direction). Some portions of the scan line SL may correspond to the switching gate electrode G2 and the compensation gate electrode G3. For example, a portion of the scan line SL overlapping the switching channel region A2 may be the switching gate electrode G2. Also, a portion of the scan line SL overlapping the compensation channel region A3 may be the compensation gate electrode G3.

The previous scan line SLp may extend in the first direction (e.g., x direction or −x direction). Some portions of the previous scan line SLp may correspond to the first initialization gate electrode G4. For example, a portion of the previous scan line SLp overlapping the first initialization channel region A4 may be the first initialization gate electrode G4.

The first wiring WL1 may extend in the first direction (e.g., x direction or −x direction). Some portions of the first wiring WL1 may correspond to the operation control gate electrode G5, the emission control gate electrode G6, and the additional gate electrode G8. For example, an operation of the first wiring WL1 overlapping the operation control channel region A5 may be the operation control gate electrode G5. Also, a portion of the first wiring WL1 overlapping the emission control channel region A6 may be the emission control gate electrode G6. Also, a portion of the first wiring WL1 overlapping the additional channel region A8 may be the additional gate electrode G8. The first wiring WL1 may be the emission control line EL. However, this is merely an example, and the first wiring WL1 is not limited to the emission control line EL.

The next scan line SLn may extend in the first direction (e.g., x direction or −x direction). Some portions of the next scan line SLn may correspond to the second initialization gate electrode G7. For example, a portion of the next scan line SLn overlapping the second initialization channel region A7 may be the second initialization gate electrode G7.

The initialization voltage line VL may be arranged in the first direction (e.g., x direction or −x direction). The initialization voltage line VL may be connected to the first initialization transistor T4 and the second initialization transistor T7 through a conductive pattern. The initialization voltage line VL may have a constant voltage (e.g., −2 V).

In an embodiment, the scan line SL, the previous scan line SLp, the next scan line SLn, the first wiring WL1, the initialization voltage line VL, and the driving gate electrode G1 may be located on the same layer, and may include the same material.

The upper conductive layer UCDL (FIG. 4C) may be located on the gate conductive layer GL. The upper conductive layer UCDL may include the data line DL and the second wiring WL2. In an embodiment, at least one of the data line DL and the second wiring WL2 may be a wiring overlapping the sub-pixel area PXA and extending in the second direction (e.g., y direction or −y direction).

The second wiring WL2 may extend in the second direction (e.g., y direction or −y direction) intersecting the first direction (e.g., x direction or −x direction). In an embodiment, the second wiring WL2 may extend substantially in the second direction (e.g., y direction or −y direction).

The second wiring WL2 may be the driving voltage line PL. The second wiring WL2 may be connected to the additional source region S8 and the additional drain region D8 of the additional transistor T8. In this case, because the second wiring WL2 applies the same second driving voltage ELVDD to the additional source region S8 and the additional drain region D8, a floating node which may occur during operation of the additional transistor T8 may be prevented. This is merely an example, and the second wiring WL2 is not limited to the driving voltage line PL.

The driving voltage line PL may cover the driving gate electrode G1, and may include the storage capacitor Cst along with the driving gate electrode G1. That is, the storage capacitor Cst may include a first electrode CE1 and a second electrode CE2, and the first electrode CE1 may be the driving gate electrode G1 and the second electrode CE2 may be a part of the driving voltage line PL. That is, the first electrode CE1 may be integrally formed with the driving gate electrode G1.

The second wiring WL2 may be the initialization voltage line VL. In this case, because the second wiring WL2 applies the same initialization voltage Vint to the additional source region S8 and the additional drain region D8, a floating node which may occur during operation of the additional transistor T8 may be prevented.

The second wiring WL2 may be electrically connected to a counter electrode. In this case, because the second wiring WL2 applies the same common voltage ELVSS to the additional source region S8 and the additional drain region D8, a floating node which may occur during operation of the additional transistor T8 may be prevented.

The data line DL may extend in the second direction (e.g., y direction or −y direction). When the data line DL extends in the second direction, the data line DL may overlap the shielding portion SR located on the semiconductor layer Act. In this case, the shielding portion SR may shield the data line DL by overlapping the data line DL, thereby preventing driving current of the display element DPE from fluctuating due to a change in a voltage of the driving gate electrode G1 according to a change in the data signal Dm. That is, because a constant voltage is applied to the shielding portion SR, a voltage of the driving gate electrode G1 may be stable.

Figure 5:
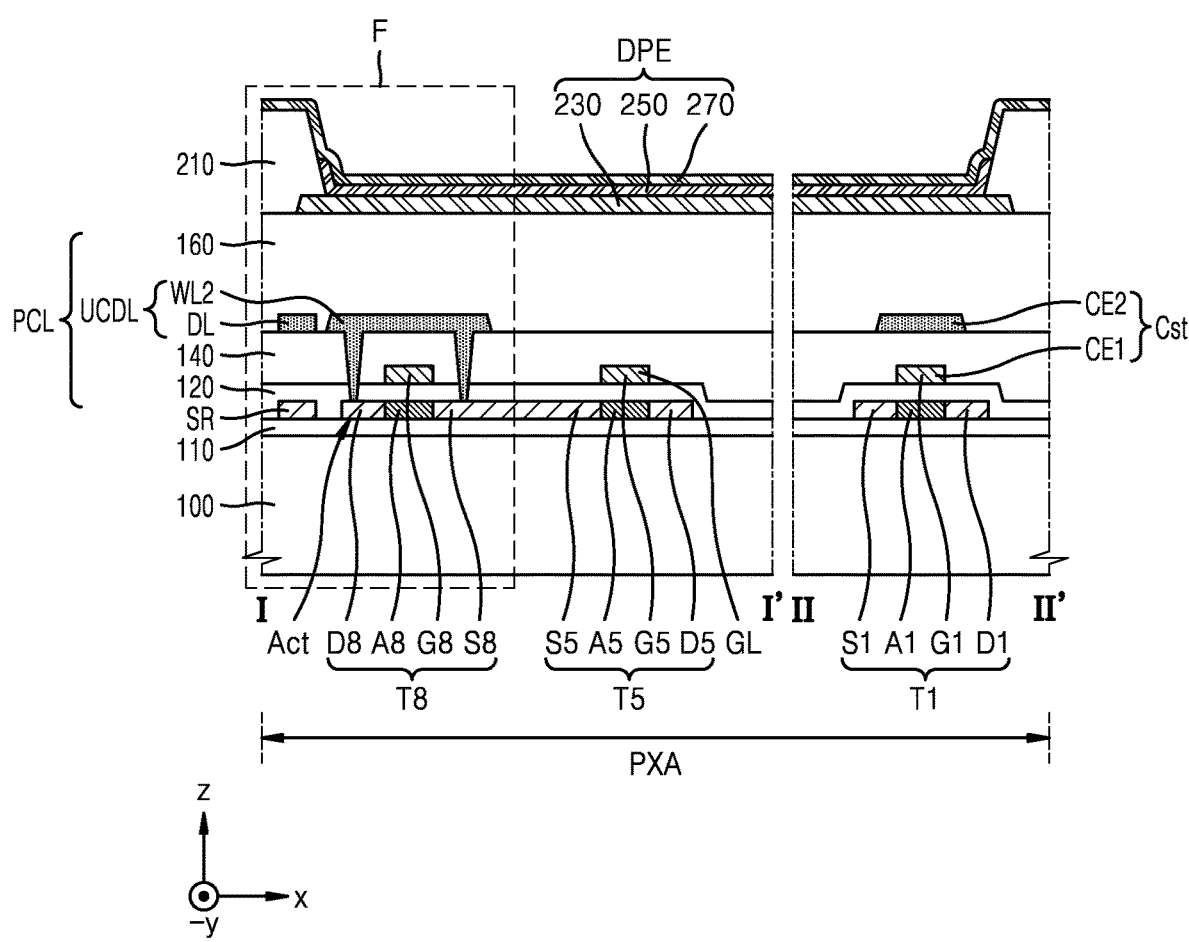
FIG. 5 is a cross-sectional view taken along lines I-I' and II-II' of FIG. 3.
Figure 6:
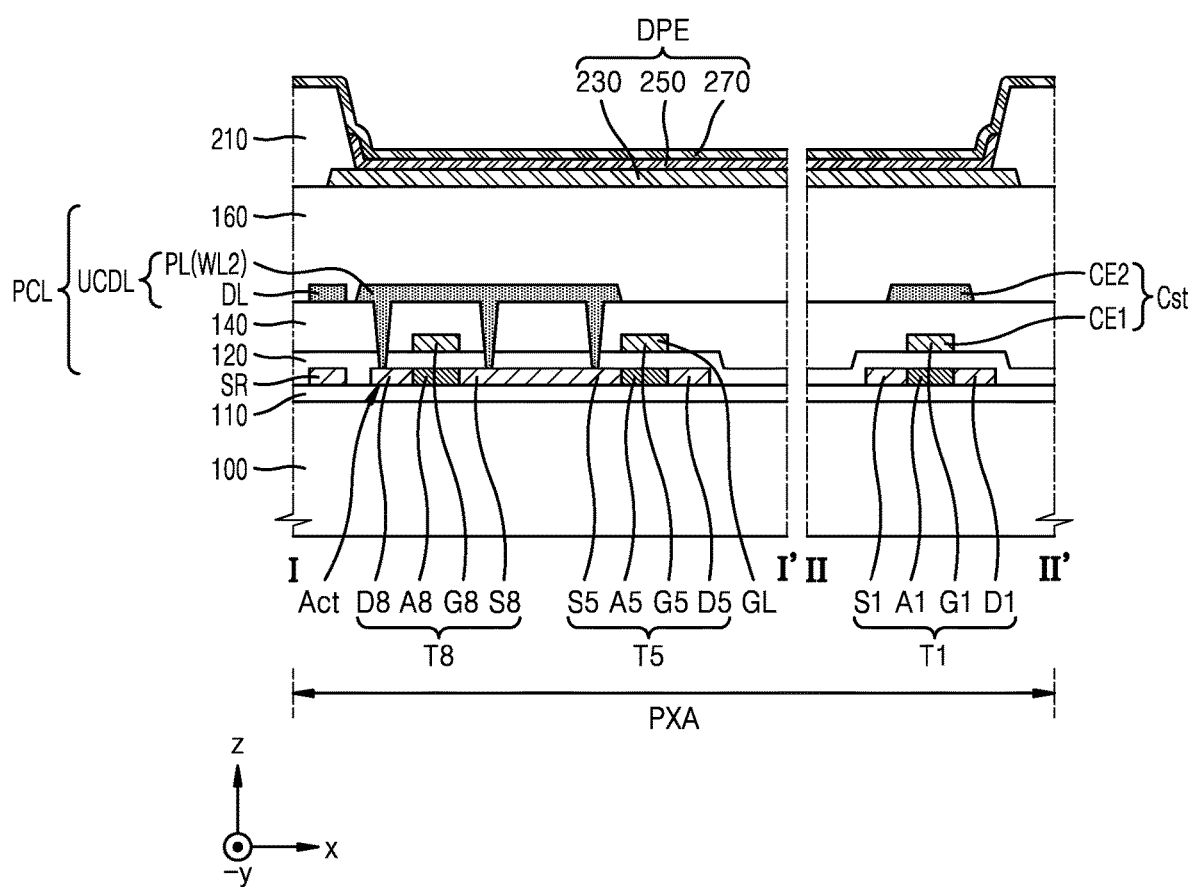
FIG. 6 is a cross-sectional view taken along lines I-I' and II-II' of FIG. 3.
Figure 7:
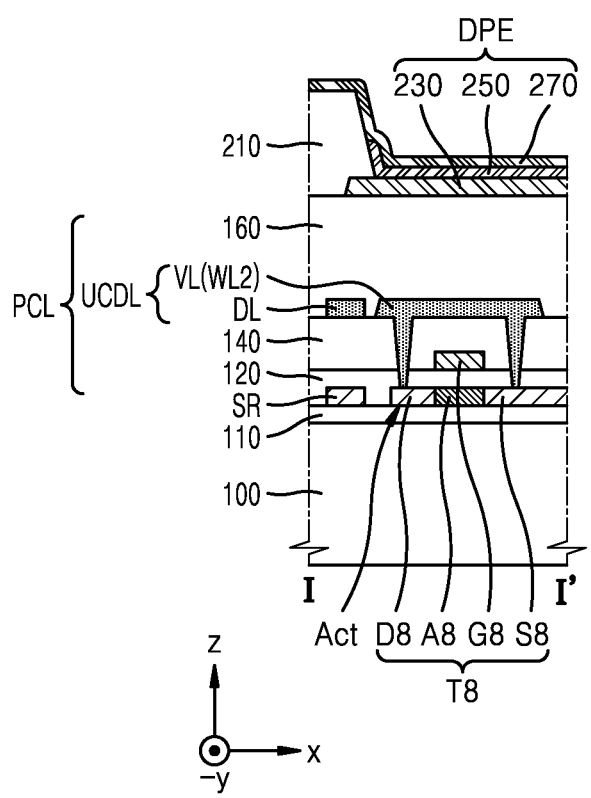
FIG. 7 is a cross-sectional view illustrating a display apparatus, according to an embodiment.

FIGS. 5 and 6 are cross-sectional views illustrating the display apparatus 1, taken along lines I-I' and II-II' of FIG. 3. FIG. 7 is an enlarged view illustrating a modification of a portion F of FIG. 8. In FIGS. 5 through 8, the same members as those in FIG. 3 are denoted by the same reference numerals, and thus a repeated description thereof will be omitted.

Referring to FIG. 5, the display apparatus 1 may include the substrate 100, the pixel circuit layer PCL, and the display element DPE. The pixel circuit layer PCL may define the pixel circuit PC. In other words, the pixel circuit layer PCL may include the pixel circuit PC. An organic light-emitting diode OLED may be included as the display element DPE.

The substrate 100 may include the sub-pixel area PXA. In an embodiment, the substrate 100 may include a plurality of sub-pixel areas PXA. In an embodiment, one pixel circuit PC may be located in the sub-pixel area PXA. In an embodiment, one organic light-emitting diode OLED may be located in the sub-pixel area PXA.

The pixel circuit layer PCL defining the pixel circuit PC may be located on the substrate 100. The pixel circuit layer PCL may include a buffer layer 110, the semiconductor layer Act, a first insulating layer 120, the gate conductive layer GL, a third insulating layer 140, and the upper conductive layer UCDL.

The semiconductor layer Act may be located on the buffer layer 110. In an embodiment, the semiconductor layer Act may include the additional source region S8, the additional channel region A8, the additional drain region D8, the operation control source region S5, the operation control channel region A5, the operation control drain region D5, the driving source region S1, the driving channel region A1, and the driving drain region D1. In an embodiment, the semiconductor layer Act may include the shielding portion SR.

The shielding portion SR may completely cover a width of the data line DL in the first direction (e.g., in FIG. 3, x direction or −x direction). The shielding portion SR may be located on the semiconductor layer Act and may be integrally formed with the additional semiconductor layer including the additional source region S8, the additional channel region A8, and the additional drain region D8. Because the shielding portion SR is integrally formed with the additional semiconductor layer, the additional channel region A8 and the additional gate electrode G8 may be formed to form the additional transistor T8.

The shielding portion SR may be conductive. The shielding portion SR may shield the data line DL by overlapping the data line DL, thereby preventing driving current of the display element DPE from fluctuating due to a change in a voltage of the driving gate electrode G1 according to a change in the data signal Dm. That is, because a constant voltage is applied to the shielding portion SR, a voltage of the driving gate electrode G1 may be stable.

The first insulating layer 120 may be located between the semiconductor layer Act and the gate conductive layer GL. The first insulating layer 120 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may include zinc oxide (ZnO) or zinc peroxide ($ZnO_2$).

The gate conductive layer GL may be located on the first insulating layer 120. In an embodiment, the gate conductive layer GL may include the scan line SL, the previous scan line SLp, the next scan line SLn, and the first wiring WL1. In an embodiment, the first wiring WL1 may be the emission control line EL. The scan line SL may extend in the first direction (e.g., in FIG. 3, x direction or −x direction). In an embodiment, a portion of the scan line SL may correspond to the switching gate electrode G2. The previous scan line SLp may extend in the first direction (e.g., in FIG. 3, x direction or −x direction). The first wiring WL1 may extend in the first direction (e.g., in FIG. 3, x direction or −x direction). In an embodiment, a portion of the first wiring WL1 may be the operation control gate electrode G5.

The gate conductive layer GL may include a low-resistance metal material. In an embodiment, the gate conductive layer GL may include a conductive material including molybdenum (Mo), aluminum (Al), copper (Cu), or titanium (Ti), and may have a single or multi-layer structure including the above material. The gate conductive layer GL may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (TI), tungsten (W), or copper (Cu), and may have a single or multi-layer structure including the above material.

The third insulating layer 140 may cover the gate conductive layer GL. The third insulating layer 140 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$), like the first insulating layer 120.

The upper conductive layer UCDL may be located on the third insulating layer 140. In an embodiment, the upper conductive layer UCDL may include the second wiring WL2 and the second electrode CE2. In an embodiment, the upper conductive layer UCDL may include the data line DL, the driving voltage line PL, and the second electrode CE2.

The shielding portion SR on the semiconductor layer Act is integrally formed with the semiconductor layer of the additional transistor T8 and thus may be robust to electrostatic discharge (ESD). In this case, a floating node may occur due to overlapping of the first wiring WL1 including the additional gate electrode G8 and the additional channel region A8 of the additional transistor T8. The second wiring WL2 may be connected to the additional source region S8 and the additional drain region D8. Accordingly, when the additional transistor T8 is driven, the same constant voltage may be applied to the additional source region S8 and the additional drain region D8, thereby preventing a floating node.

In an embodiment, the second electrode CE2 may overlap the driving gate electrode G1 located below the second electrode CE2. In this case, the driving gate electrode G1 and the second electrode CE2 overlapping each other with the third insulating layer 140 therebetween may form the storage capacitor Cst. That is, the driving gate electrode G1 may function as the first electrode CE1 of the storage capacitor Cst.

As such, the storage capacitor Cst and the driving transistor T1 may overlap each other. In some embodiments, the storage capacitor Cst may not overlap the driving transistor T1.

A second insulating layer 160 may be located on the third insulating layer 140 to cover the upper conductive layer UCDL. The second insulating layer 160 may include an organic insulating material such as a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element DPE may be located on the second insulating layer 160. The display element DPE may include a pixel electrode 230, an emission layer 250, and a counter electrode 270. In an embodiment, the display element DPE may be the organic light-emitting diode OLED.

The pixel electrode 230 may be located on the second insulating layer 160. Although not shown, the pixel electrode 230 may be electrically connected to the emission control transistor T6 through a contact hole of the second insulating layer 160. The pixel electrode 230 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 230 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 230 may further include a film formed of ITO, IZO, ZnO, or $In_2O_3$ over/under the above reflective film. The disclosure is not limited thereto, and the pixel electrode 230 may be formed of any of various materials, and may have a single or multi-layer structure.

A pixel-defining film 210 defining an emission area by using an opening through which at least a part of the pixel electrode 230 is exposed may be located on the pixel electrode 230. The pixel-defining film 210 may include an organic insulating material or an inorganic insulating material. In some embodiments, the pixel-defining film 210 may include a light-blocking material.

The emission layer 250 may be located in the opening of the pixel-defining film 210. In an embodiment, the emission layer 250 may be an organic emission layer. The emission layer 250 may include any of various high molecular weight or low molecular weight organic materials such as copper phthalocyanine (CuPc), N,N'-Di(naphthalene-1-yl)-N,N'-diphenyl-benzidine (NPB), or tris-8-hydroxyquinoline aluminum ($Alq_3$).

The counter electrode 270 may be located on the emission layer 250 and the pixel-defining film 210. The counter electrode 270 may be formed of a conductive material having a low work function. For example, the counter electrode 270 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 270 may further include a layer such as ITO, IZO, ZnO, or $In_2O_3$ on the (semi)transparent layer including the above material.

Although not shown, an encapsulation layer may be located on the display element DPE to protect the display element DPE.

The encapsulation layer may include at least one inorganic encapsulation layer and at least one organic encapsulation layer. In an embodiment, the at least one inorganic encapsulation layer and the at least one organic encapsulation layer may be alternately stacked. The inorganic encapsulation layer may include at least one inorganic material from among aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). The organic encapsulation layer may include a polymer-based material. Examples of the polymer-based material may include an acrylic resin, an epoxy resin, polyimide, and polyethylene. In an embodiment, the organic encapsulation layer may include acrylate.

In another embodiment, a sealing substrate may be located on the display element DPE. The sealing substrate may seal the display element DPE along with a sealing member located in the non-display area NDA.

A touch sensor layer may be located on the encapsulation layer or the sealing substrate. The touch sensor layer may obtain coordinate information according to an external input, for example, a touch event.

Referring to FIG. 6, the second wiring WL2 may be the driving voltage line PL. The driving voltage line PL may be included in the upper conductive layer UCDL. The second wiring WL2 may be connected to the additional source region S8 and the additional drain region D8 of the additional transistor T8. In this case, because the second wiring WL2 applies the same driving voltage ELVDD to the additional source region S8 and the additional drain region D8, a floating node which may occur during operation of the additional transistor T8 may be prevented. This is merely an example, and the second wiring WL2 is not limited to the driving voltage line PL.

Referring to FIG. 7, the second wiring WL2 may be the initialization voltage line VL. In an embodiment, the initialization voltage line VL may be included in the upper conductive layer UCDL. In this case, because the second wiring WL2 applies the same initialization voltage Vint to the additional source region S8 and the additional drain region D8, a floating node which may occur during operation of the additional transistor T8 may be prevented.

Figure 8:
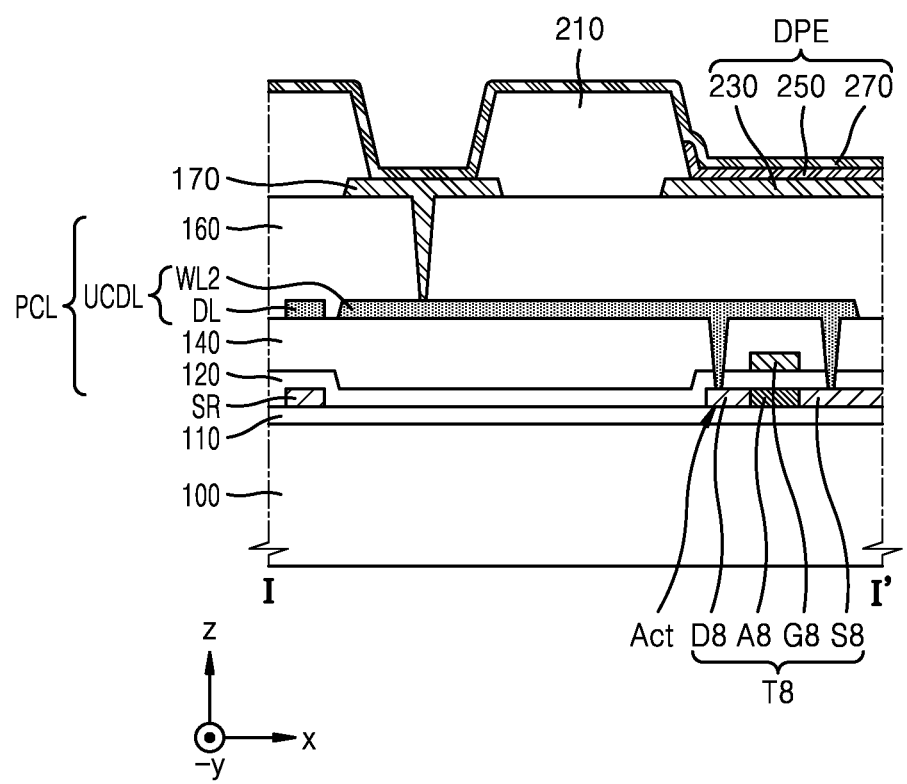
FIG. 8 is a cross-sectional view illustrating a display apparatus, according to an embodiment.

Referring to FIG. 8, the second wiring WL2 may be electrically connected to the counter electrode 270. The second wiring WL2 may be connected to a connection conductive layer 170, and the connection conductive layer 170 may be electrically connected to the counter electrode 270. In this case, because the second wiring WL2 applies the same common voltage ELVSS to the additional source region S8 and the additional drain region D8, a floating node which may occur during operation of the additional transistor T8 may be prevented.

Figure 9:
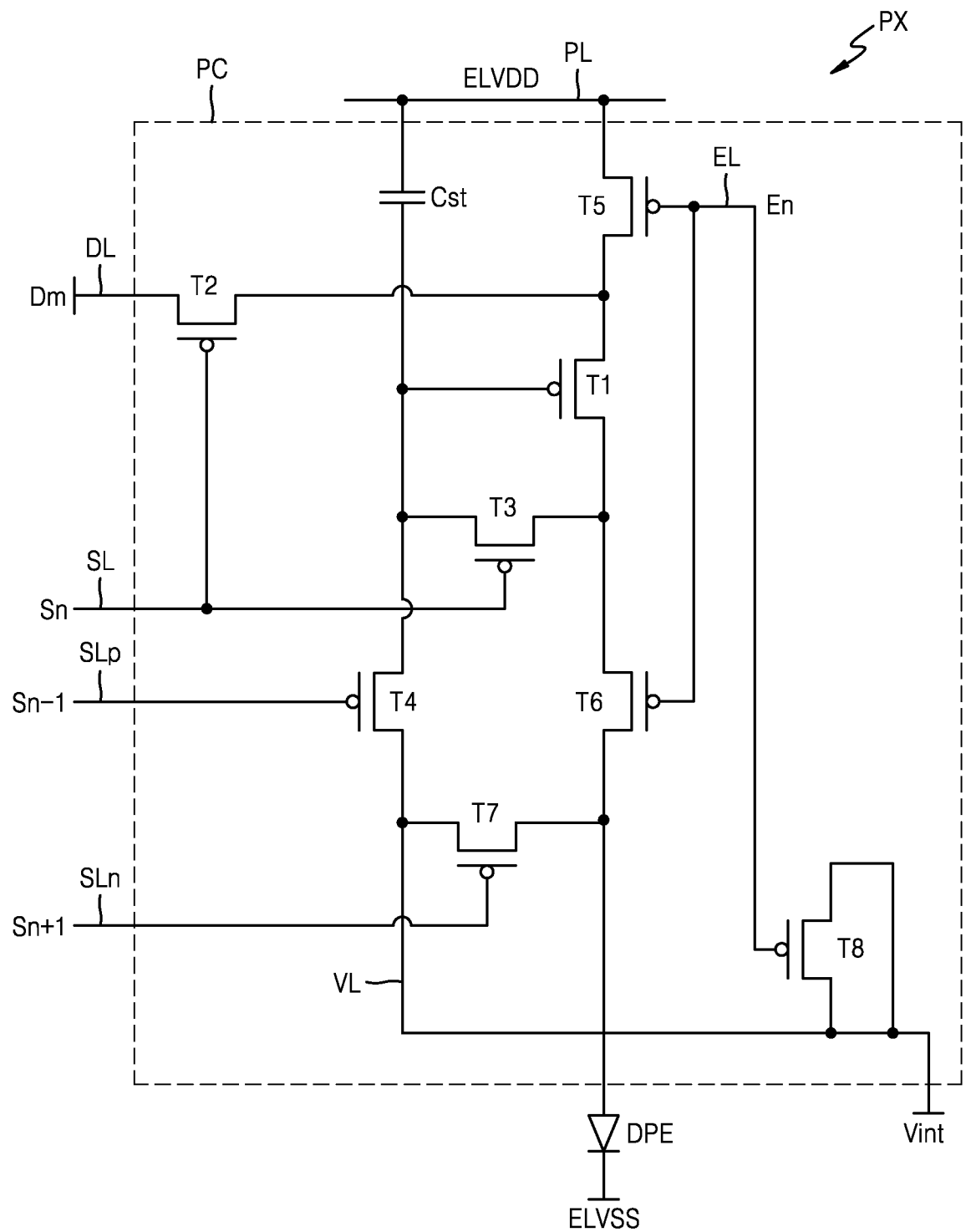
FIG. 9 is an equivalent circuit diagram illustrating a sub-pixel included in a display apparatus, according to an embodiment.
Figure 10:
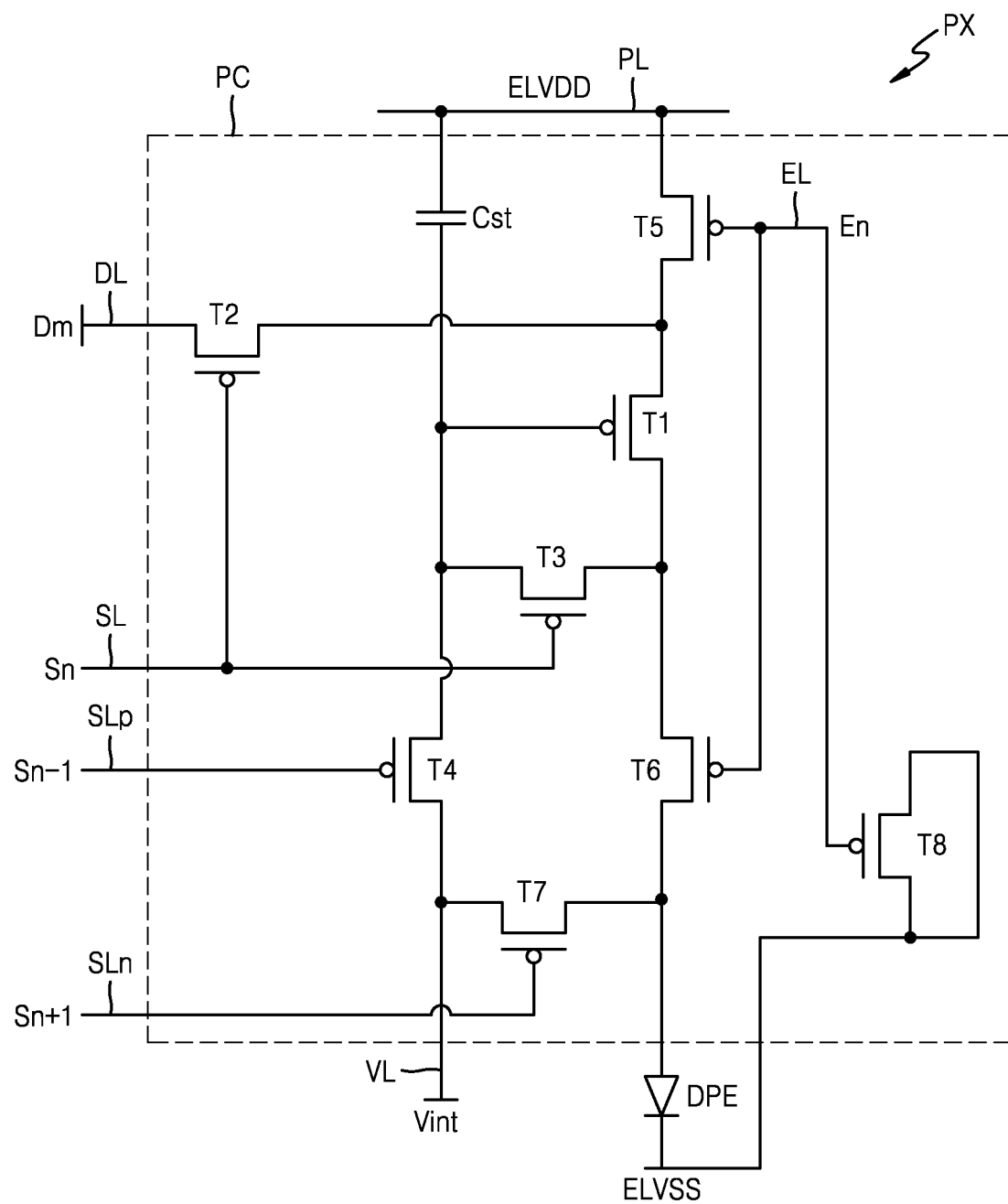
FIG. 10 is an equivalent circuit diagram illustrating a sub-pixel included in a display apparatus, according to an embodiment.

FIGS. 9 and 10 are equivalent circuit diagrams illustrating a sub-pixel included in a display apparatus, according to an embodiment. In FIGS. 9 and 10, the same members as those in FIGS. 2, 3, and 5 are denoted by the same reference numerals, and thus a repeated description thereof will be omitted.

Referring to FIGS. 9 and 10, the pixel circuit PC may include the driving transistor T1, the switching transistor T2, the compensation transistor T3, the first initialization transistor T4, the operation control transistor T5, the emission control transistor T6, the second initialization transistor T7, the additional transistor T8, and the storage capacitor Cst.

The additional gate electrode G8 of the additional transistor T8 may be electrically connected to the emission control gate electrode G6 of the emission control transistor T6. The additional source region S8 and the additional drain region D8 of the additional transistor T8 may be connected to the second wiring WL2. When the additional transistor T8 is driven, the second wiring WL2 may apply the same constant voltage to the additional source region S8 and the additional drain region D8 of the additional transistor T8. Accordingly, a floating node may not occur in the additional transistor T8. The second wiring WL2 may be the driving voltage line PL for applying the driving voltage ELVDD to the emission control transistor T6. In this case, when the additional transistor T8 is driven, the same driving voltage ELVDD may be applied to the additional source region S8 and the additional drain region D8 of the additional transistor T8, thereby preventing a floating node. Accordingly, because the shielding portion SR located on the same layer as the semiconductor layer and overlapping the data line DL is integrally formed with the additional semiconductor layer of the additional transistor T8, the semiconductor layer Act may not include an island structure and thus may be robust to electrostatic discharge (ESD). The same effect may be obtained even when another type of second wiring WL2 described below is used.

Referring to FIG. 9, the second wiring WL2 may be the initialization voltage line VL for applying the initialization voltage Vint to the first initialization transistor T4. In this case, when the additional transistor T8 is driven, the same initialization voltage Vint may be applied to the additional source region S8 and the additional drain region D8 of the additional transistor T8, thereby preventing a floating node. Also, the semiconductor layer Act may not include an island structure, and thus may be robust to electrostatic discharge (ESD).

Referring to FIG. 10, the second wiring WL2 may be electrically connected to the counter electrode 270 of the display element DPE that receives the common voltage ELVSS. In this case, when the additional transistor T8 is driven, the same common voltage ELVSS may be applied to the additional source region S8 and the additional drain region D8 of the additional transistor T8, thereby preventing a floating node. Also, the semiconductor layer Act may not include an island structure, and thus may be robust to electrostatic discharge (ESD).

As described above, in the display apparatus according to an embodiment, because a source region and a drain region of an additional transistor are connected to a wiring for supplying the same constant voltage, crosstalk may be prevented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope of the following claims.

What is claimed is:

1. A display apparatus comprising:
   a substrate;
   an additional transistor located on the substrate and comprising an additional semiconductor layer and an additional gate electrode;
   a first wiring integrally formed with the additional gate electrode and extending in a first direction;
   a first insulating layer located on the first wiring; and a second wiring located on the first insulating layer and extending in a second direction intersecting the first direction,
wherein the second wiring is directly connected to a source region and a drain region of the additional semiconductor layer.

2. The display apparatus of claim 1, further comprising:
a data line located on the first insulating layer; and
a shielding portion located on a same layer as the additional semiconductor layer and overlapping the data line,
wherein the shielding portion is integrally formed with the additional semiconductor layer.

3. The display apparatus of claim 1, further comprising an operation control transistor comprising an operation control semiconductor layer and an operation control gate electrode,
wherein the second wiring is a driving voltage line for applying a driving voltage to a source region of the operation control semiconductor layer.

4. The display apparatus of claim 3, further comprising:
a driving transistor comprising a driving semiconductor layer and a driving gate electrode; and
a capacitor overlapping the driving transistor and comprising a first electrode and a second electrode,
wherein the driving gate electrode is integrally formed with the second electrode, and
a source region of the driving semiconductor layer is connected to a drain region of the operation control semiconductor layer.

5. The display apparatus of claim 4, further comprising an emission control transistor comprising an emission control semiconductor layer and an emission control gate electrode,
wherein a source region of the emission control semiconductor layer is connected to a drain region of the driving semiconductor layer, and
the first wiring is connected to the emission control gate electrode.

6. The display apparatus of claim 1, further comprising a first initialization transistor comprising a first initialization semiconductor layer and a first initialization gate electrode,
wherein the second wiring is an initialization voltage line for applying an initialization voltage to the first initialization transistor.

7. The display apparatus of claim 6, further comprising:
a driving transistor comprising a driving semiconductor layer and a driving gate electrode; and
a capacitor overlapping the driving transistor and comprising a first electrode and a second electrode,
wherein the driving gate electrode is integrally formed with the second electrode, and
a source region of the first initialization semiconductor layer is connected to the driving gate electrode.

8. The display apparatus of claim 1, further comprising:
a second insulating layer located on the second wiring;
a pixel electrode located on the second insulating layer and comprising an opening through which at least a part of the pixel electrode is exposed;
an organic emission layer located on the pixel electrode in the opening; and
a counter electrode located on the organic emission layer and extending to a top surface of a pixel-defining film,
wherein the second wiring is electrically connected to the counter electrode.

9. The display apparatus of claim 8, further comprising:
an operation control transistor comprising an operation control gate electrode and an operation control semiconductor layer;
a driving transistor comprising a driving semiconductor layer and a driving gate electrode; and
a capacitor overlapping the driving transistor and comprising a first electrode and a second electrode,
wherein the driving gate electrode is integrally formed with the second electrode, and
a source region of the driving semiconductor layer is connected to a drain region of the operation control semiconductor layer.

10. The display apparatus of claim 9, further comprising an emission control transistor comprising an emission control semiconductor layer and an emission control gate electrode,
wherein a source region of the emission control semiconductor layer is connected to a drain region of the driving semiconductor layer, and
the first wiring is connected to the emission control gate electrode.

11. A display apparatus comprising:
a scan line configured to transmit a scan signal;
an emission control line configured to transmit an emission control signal;
a data line intersecting the scan line and configured to transmit a data signal;
a driving voltage line intersecting the scan line and configured to transmit a driving voltage; and
an additional transistor comprising an additional semiconductor layer and an additional gate electrode,
wherein the additional gate electrode is provided as a part of the emission control line, and
when the additional transistor is driven, a same constant voltage is applied to a source region and a drain region of the additional semiconductor layer.

12. The display apparatus of claim 11, further comprising a shielding portion located on a same layer as the additional semiconductor layer and overlapping the data line,
wherein the shielding portion is integrally formed with the additional semiconductor layer.

13. The display apparatus of claim 11, wherein the driving voltage line is connected to the source region and the drain region of the additional semiconductor layer.

14. The display apparatus of claim 11, further comprising an operation control transistor comprising an operation control semiconductor layer and an operation control gate electrode,
wherein a source region of the operation control semiconductor layer is connected to the driving voltage line, and
the operation control gate electrode is connected to the additional gate electrode.

15. The display apparatus of claim 14, further comprising:
a driving transistor comprising a driving semiconductor layer and a driving gate electrode; and
a capacitor overlapping the driving transistor and comprising a first electrode and a second electrode,
wherein the driving gate electrode is integrally formed with the second electrode, and
a source region of the driving semiconductor layer is connected to a drain region of the operation control semiconductor layer.

16. The display apparatus of claim 15, further comprising an emission control transistor comprising an emission control semiconductor layer and an emission control gate electrode,
wherein a source region of the emission control semiconductor layer is connected to a drain region of the driving semiconductor layer, and the emission control line is connected to the emission control gate electrode.

17. The display apparatus of claim 11, further comprising:
a first initialization transistor comprising a first initialization semiconductor layer and a first initialization gate electrode; and
an initialization voltage line configured to apply an initialization voltage to the first initialization transistor,
wherein each of the source region and the drain region of the additional semiconductor layer is connected to the initialization voltage line.

18. The display apparatus of claim 17, further comprising:
a driving transistor comprising a driving semiconductor layer and a driving gate electrode; and
a capacitor overlapping the driving transistor and comprising a first electrode and a second electrode,
wherein the driving gate electrode is integrally formed with the second electrode, and
a source region of the first initialization semiconductor layer is connected to the driving gate electrode.

19. The display apparatus of claim 18, further comprising a second initialization transistor comprising a second initialization semiconductor layer and a second initialization gate electrode,
wherein a source region of the second initialization semiconductor layer is connected to a drain region of the first initialization semiconductor layer.

20. The display apparatus of claim 11, further comprising:
a display element comprising a pixel electrode and a counter electrode; and
a second wiring configured to apply a same constant voltage,
wherein the second wiring is electrically connected to the counter electrode.

* * * * *